US012412798B2

(12) United States Patent
Chang

(10) Patent No.: US 12,412,798 B2
(45) Date of Patent: Sep. 9, 2025

(54) SEMICONDUCTOR DEVICE AND METHOD OF FORMING

(71) Applicant: Taiwan Semiconductor Manufacturing Company Limited, Hsin-Chu (TW)

(72) Inventor: Jen-Yuan Chang, Hsinchu (TW)

(73) Assignee: Taiwan Semiconductor Manufacturing Company Limited, Hsin-Chu (TW)

( * ) Notice: Subject to any disclaimer, the term of this patent is extended or adjusted under 35 U.S.C. 154(b) by 0 days.

(21) Appl. No.: 18/593,626

(22) Filed: Mar. 1, 2024

(65) Prior Publication Data

US 2024/0203810 A1 Jun. 20, 2024

Related U.S. Application Data

(62) Division of application No. 17/361,474, filed on Jun. 29, 2021, now Pat. No. 11,923,263.

(60) Provisional application No. 63/163,704, filed on Mar. 19, 2021.

(51) Int. Cl.
*H01L 23/31* (2006.01)
*H01L 21/56* (2006.01)
*H01L 25/065* (2023.01)

(52) U.S. Cl.
CPC .......... *H01L 23/3121* (2013.01); *H01L 21/56* (2013.01); *H01L 25/0657* (2013.01)

(58) Field of Classification Search
CPC ............................................... H01L 2924/3511
See application file for complete search history.

(56) References Cited

U.S. PATENT DOCUMENTS

2018/0096946 A1   4/2018  Meyers et al.
2018/0175011 A1*  6/2018  Sung ..................... H01L 21/565
2018/0269188 A1   9/2018  Yu et al.
2019/0148653 A1   5/2019  Chen et al.

OTHER PUBLICATIONS

Office Action received in corresponding Taiwanese patent application No. 110131090, dated Sep. 3, 2024, 12 pages.

* cited by examiner

*Primary Examiner* — Yu-Hsi D Sun
(74) *Attorney, Agent, or Firm* — Cooper Legal Group, LLC

(57) ABSTRACT

A semiconductor device includes a substrate, a chip underlying the substrate, a chip overlying the substrate, and a dummy die overlying the substrate. A pattern of the dummy die includes a first interior sidewall and a second interior sidewall, and a stress relief material between the first interior sidewall and the second interior sidewall to form a dummy die stress balance pattern.

19 Claims, 9 Drawing Sheets

SEMICONDUCTOR DEVICE AND METHOD OF FORMING

RELATED APPLICATIONS

This application is a divisional of and claims priority to U.S. Non-Provisional application Ser. No. 17/361,474, titled "SEMICONDUCTOR DEVICE AND METHOD OF FORMING" and filed on Jun. 29, 2021, which claims priority to U.S. Provisional Application 63/163,704, titled "DUMMY DIE FOR AN INTEGRATED CIRCUIT" and filed on Mar. 19, 2021. U.S. Non-Provisional application Ser. No. 17/361,474 and U.S. Provisional Application 63/163,704 are incorporated herein by reference.

BACKGROUND

Circuit board assemblies are used in a multitude of electronic devices, such as mobile phones, laptops, desktops, tablets, watches, gaming systems, and various other industrial, commercial, and consumer electronics. A circuit board assembly typically includes a die mounted on a circuit board. A die includes a block of semiconductor material having one or more of a substrate, doped, undoped, implant, and isolation regions. Many devices include circuit board assemblies that include one or more dies directly or indirectly mounted to one of or both sides of a circuit board.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
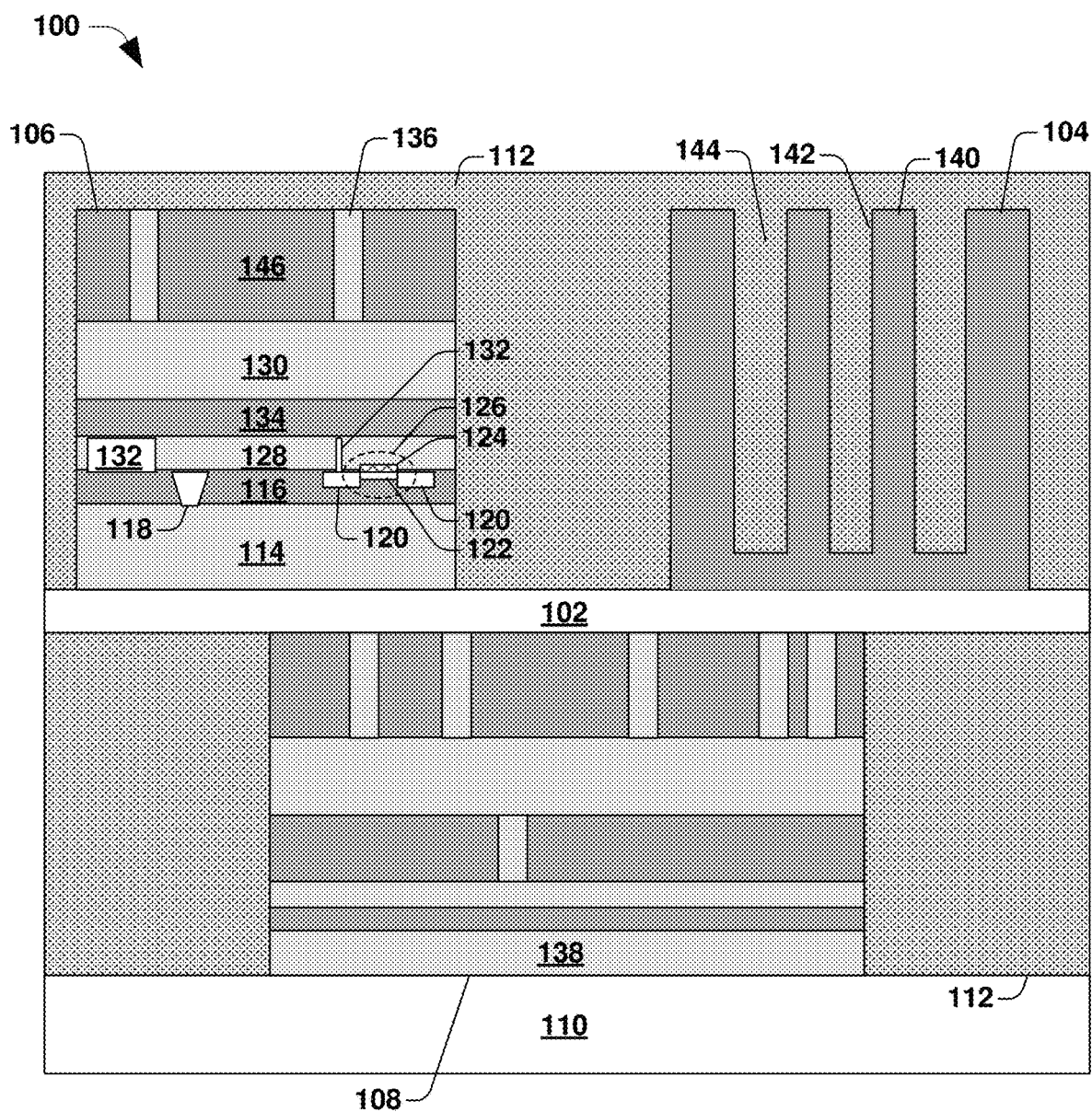
FIG. 1 is an illustration of a side view of a semiconductor device, according to some embodiments.

The following disclosure provides several different embodiments, or examples, for implementing different features of the provided subject matter. Specific examples of components and devices are described below to simplify the present disclosure. These are, of course, merely examples and are not intended to be limiting. For example, the formation of a first feature over or on a second feature in the description that follows may include embodiments in which the first and second features are formed in direct contact and may also include embodiments in which additional features may be formed between the first and second features, such that the first and second features may not be in direct contact. In addition, the present disclosure may repeat reference numerals or letters in the various examples. This repetition is for the purpose of simplicity and clarity and does not in itself dictate a relationship between the various embodiments or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation illustrated in the figures. The apparatus may be otherwise oriented (rotated 90 degrees or at other orientations) and the spatially relative descriptors used herein may likewise be interpreted accordingly. Also, relationship terms such as "connected to," "adjacent to," "coupled to," and the like, may be used herein to describe both direct and indirect relationships. "Directly" connected, adjacent, or coupled may refer to a relationship in which there are no intervening components, devices, or structures. "Indirectly" connected, adjacent, or coupled may refer to a relationship in which there are intervening components, devices, or structures.

A semiconductor device having one or more dummy dies is disclosed herein. A dummy die includes a stress balance pattern to counterbalance the mass of a chip mounted on a substrate. According to some embodiments, the stress balance pattern of the dummy die is formed to reduce the mass of the dummy die so as to mitigate substrate warpage. According to some embodiments, the stress balance pattern of the dummy die is formed to distribute the mass of the dummy die on the substrate in a manner to counterbalance the distribution of the mass of the chip on the substrate. Counterbalancing the chip and mitigating substrate warpage increases yield by reducing forces such as stresses, strains, etc. that might otherwise be experienced by the chip which can adversely affect the performance, reliability, etc. of the chip, devices formed on the chip, etc.

A method of forming a semiconductor device comprising a dummy die to counterbalance a chip on a substrate includes bonding the dummy die to the substrate, forming a photolithographic pattern on the dummy die, using the photolithographic pattern to pattern the dummy die to have a pattern, such as one or more gaps, openings, voids, etc., in the dummy die, filling at least some of the pattern formed in the dummy die with a stress relief material, and filling a gap between the chip and the dummy die with a material that may or may not be the same as the stress relief material. According to some embodiments, the dummy die is said to have a stress balance pattern, where the stress balance pattern corresponds to the patterned dummy die, the stress relief material filled into the patterned dummy die, or the combination of the patterned dummy die and the stress relief material filled into the patterned dummy die. Forming the dummy die to have the stress balance pattern after bonding the dummy die to the substrate may utilize some processing actions that are used in other aspects of semiconductor manufacturing, such as lithography used in forming the chip on the substrate, and thus may reduce processing overhead, such as compared to a method of forming a dummy die to have a stress balance pattern prior to bonding the dummy die to the substrate. Reducing processing overhead advantageously reduces fabrication costs, reduces materials required, reduces fabrication processing time, increases yield, etc. According to some embodiments, however, a dummy die is formed to have a stress balance pattern while the dummy die is separate from the substrate and is then bonded to the substrate.

FIG. 1 is an illustration of a semiconductor device 100, according to some embodiments. In some embodiments, the semiconductor device 100 corresponds to at least one of a circuit board assembly, a system on integrated chip (SoIC), a chip-on-wafer (CoW), a chip-on-wafer-on-substrate (CoWoS), or other suitable devices. According to some embodiments the semiconductor device 100 comprises a substrate 102, a dummy die 104 overlying the substrate 102, one or more chips, such as a first chip 106 and a second chip 108, packaging material 110 underlying the second chip 108, and stress relief material 112 that overlies and/or underlies at least one of the substrate 102, the dummy die 104, the first chip 106, the second chip 108, or the packaging material 110. According to some embodiments, the first chip 106 overlies the substrate 102 and the second chip 108, the dummy die 104 overlies the substrate 102 and the second chip 108, and the substrate 102 underlies the first chip 106 and the dummy die 104 and overlies the second chip 108. In some embodiments, the packaging material 110 partially or completely encapsulates at least one of the substrate 102, the dummy die 104, the first chip 106, the second chip 108, or the stress relief material 112.

According to some embodiments, the substrate 102 comprises least one of an epitaxial layer, a single crystalline semiconductor material, such as, but not limited to, at least one of Si, Ge, SiGe, InGaAs, GaAs, InSb, GaP, GaSb, InAlAs, GaSbP, GaAsSb, or InP, a silicon-on-insulator (SOI) structure, or a die formed from a substrate. In some embodiments, the substrate 102 comprises at least one of crystalline silicon or other suitable materials. According to some embodiments, a substrate as used herein (not just with reference to FIG. 1) comprises some or all of a wafer. Other configurations and/or compositions of the substrate 102 are within the scope of the present disclosure.

According to some embodiments, the dummy die 104 comprises at least one of silicon or other suitable materials. In some embodiments, the dummy die 104 comprises a single component, composite structure, etc. having a pattern formed therein comprising or defined by dummy die segments 140 comprising interior sidewalls 142 defining gaps 144, openings, voids, etc. in the dummy die 104. The gaps 144 are at least partially filled with the stress relief material 112. In some embodiments, the dummy die 104 comprises one or more layers, at least some of which have a same material composition. In some embodiments, the dummy die 104 comprises one or more layers, at least some of which have a different material composition. The material composition of the dummy die 104 and/or the pattern formed in the dummy die 104 and filled with the stress relief material 112 are fashioned such that little to no warpage is induced within the substrate 102 by the dummy die and/or such that the mass of the dummy die is distributed on the substrate in a manner suitable to counterbalance at least some of the distribution of the mass of one or more chips, such as the first chip 106, the second chip 108, etc., on the substrate 102. Other configurations and/or compositions of the dummy die 104 are within the scope of the present disclosure.

In some embodiments, the stress relief material 112 comprises a material having a particular dielectric constant, k, value, such as at least one of low-k, ultra low-K (ULK), extra low-K (ELK), extreme low-k (XLK), or high-k. Low-k dielectric materials generally have a k-value lower than about 3.9. Some low-k dielectric materials have a k-value lower than about 3.5. ULK generally refers to materials with a k value of between about 2.7 to about 2.4. ELK generally refers to materials with a k value of between about 2.3 to about 2.0. XLK generally refers to materials with a k value of less than about 2.0. High-k dielectric materials generally have a k value greater than or equal to about 3.9, which is the k value of $SiO_2$. According to some embodiments, the stress relief material 112 comprises $Al_2O_3$, $HfO_2$, $ZrO_2$, $La_2O_3$, $TiO_2$, $SrTiO_3$, $LaAlO_3$, $Y_2O_3$, $Al_2O_xN_y$, $HfO_xN_y$, $ZrO_xN_y$, $La_2O_xN_y$, $TiO_xN_y$, $SrTiO_xN_y$, $LaAlO_xN_y$, $Y_2O_xN_y$, SiON, $SiN_x$, a silicate thereof, an alloy thereof and/or other suitable materials, where each value of x is independently from 0.5 to 3, and each value of y is independently from 0 to 2. In some embodiments, the stress relief material 112 comprises Si, O, C, or H, such as SiCOH, SiOC, oxygen-doped SiC (ODC), nitrogen-doped SiC (NDC), plasma-enhanced oxide (PEOX), and/or other suitable materials. Organic material such as polymers may be used for the stress relief material 112 in some embodiments. According to some embodiments, the stress relief material 112 comprises undoped silicate glass (USG), a carbon-containing material, organo-silicate glass, a porogen-containing material, and/or other suitable materials. The stress relief material 112 comprises nitrogen in some embodiments.

In some embodiments, the stress relief material 112 comprises one or more layers, at least some of which have a same material composition. In some embodiments, the stress relief material 112 comprises one or more layers, at least some of which have a different material composition. In some embodiments, the material composition of the stress relief material 112 in at least one of the one or more gaps, voids, openings, etc. in the dummy die 104 is the same as the material composition of the stress relief material 112 in another of the one or more gaps, voids, openings, etc. in the dummy die 104. In some embodiments, the material composition of the stress relief material 112 in at least one of the one or more gaps, voids, openings, etc. in the dummy die 104 is different than the material composition of the stress relief material 112 in another of the one or more gaps, voids, openings, etc. in the dummy die 104. In some embodiments, the material composition of the stress relief material 112 in at least one of the one or more gaps, voids, openings, etc. in the dummy die 104 is the same as the material composition of the stress relief material 112 between the first chip 106 and the dummy die 104. In some embodiments, the material composition of the stress relief material 112 in at least one of the one or more gaps, voids, openings, etc. in the dummy die 104 is different than the material composition of the stress relief material 112 between the first chip 106 and the dummy die 104. In some embodiments, the material composition of at least some of the stress relief material 112 above the substrate 102 is the same as the material composition of at least some of the stress relief material 112 below the substrate 102. In some embodiments, the material composition of at least some of the stress relief material 112 above the substrate 102 is different than the material composition of at least some of the stress relief material 112 below the substrate 102. The material composition of the stress relief material 112 is selected such that when the pattern formed in the dummy die 104 is filled with the stress relief material 112 little to no warpage is induced within the substrate 102 by the dummy die and/or such that the mass of the dummy die is distributed on the substrate in a manner suitable to counterbalance at least some of the distribution of the mass of one or more chips, such as the first chip 106, the second chip 108, etc., on the substrate 102. Other configurations and/or compositions of the stress relief material 112 are within the scope of the present disclosure.

According to some embodiments, the packaging material 110 comprises a polymer and/or other suitable materials. Other configurations and/or compositions of the packaging material 110 are within the scope of the present disclosure.

In some embodiments, one or more than one die is provided, wherein the one or more than one die includes one or more than one chip, such as the first chip 106 and/or the second chip 108, and one or more than one dummy die is provided, such as the dummy die 104. For illustration purposes, two chips, the first chip 106 and the second chip 108, and one dummy die 104 are shown in FIG. 1. However, the disclosure is not limited thereto. One or more than one chip and/or one or more than one dummy die are within the scope of the present disclosure, where at least one of the number, shape, size, placement, orientation, mass, stress balance pattern, etc. of the one or more dummy dies serve to balance at least one of the number, shape, size, placement, orientation, mass, etc. of the one or more chips. According to some embodiments, the number of dummy dies is the same as the number of chips. According to some embodiments, the number of dummy dies is not the same as the number of chips. According to some embodiments, at least some of the one or more dummy dies are the same, such as in at least one of shape, size, mass, weight, density, rigidity, structural integrity, material composition, stress balance pattern, etc. According to some embodiments, at least some of the one or more dummy dies are not the same, such as in at least one of shape, size, mass, weight, density, rigidity, structural integrity, material composition, stress balance pattern, etc.

In some embodiments, at least some of the first chip 106 is formed in or on a first device substrate 114. According to some embodiments, the first chip 106 corresponds to a SoIC, CoW, or CoWoS device. According to some embodiments, the first device substrate 114 comprises least one of an epitaxial layer, a single crystalline semiconductor material, such as, but not limited to, at least one of Si, Ge, SiGe, InGaAs, GaAs, InSb, GaP, GaSb, InAlAs, GaSbP, GaAsSb, or InP, a silicon-on-insulator (SOI) structure, or a die formed from a substrate. In some embodiments, the first device substrate 114 comprises at least one of crystalline silicon or other suitable materials. According to some embodiments, the first device substrate 114 has a same material composition as the substrate 102. According to some embodiments, the first device substrate 114 has a different material composition than the substrate 102. In some embodiments, the first device substrate 114 includes an implant region 116. The implant region 116 comprises at least one of a p-type substrate (P-substrate) region, an n-type substrate (N-substrate) region, doped regions or undoped regions. Other configurations and/or compositions of the first device substrate 114 are within the scope of the present disclosure.

According to some embodiments, at least some of the doped regions of the implant region 116 are formed by at least one of ion implantation, molecular diffusion, or other suitable techniques. A number or an amount of dopants implanted into the implant region 116 is controlled, such as to control a concentration of dopants in the implant region 116. In some embodiments, an energy of dopants implanted into the implant region 116 is controlled, such as to control a depth to which dopants are implanted into the implant region 116. A depth of dopants in the implant region 116 is controlled by increasing or decreasing a voltage used to direct the dopants into the implant region 116. As such, the implant region 116 comprises at least one of p-type dopants or n-type dopants. Other configurations and/or compositions of the implant region 116 are within the scope of the present disclosure.

According to some embodiments, the first chip 106 comprises one or more shallow trench isolation (STI) structures 118 formed in the implant region 116. At least some of the one or more STI structures 118 are formed prior to the formation of other components of the implant region 116. In some embodiments, formation of the STI structures 118 comprises etching a trench in the first device substrate 114 and/or one or more layers over the first device substrate 114, depositing one or more dielectric materials to fill the trench, and planarizing a top surface of the deposited dielectric material. A dielectric material of the STI structures 118 is at least one of an oxide, nitride, or other suitable materials. Other configurations and/or compositions of the STI structures 118 are within the scope of the present disclosure.

According to some embodiments, the first chip 106 comprises one or more conductive regions 120. At least some of the one or more conductive regions 120 are at least one of over the first device substrate 114 or in the first device substrate 114. At least some of the one or more conductive regions 120 are at least one of a source region or a drain region. At least some of the one or more conductive regions 120 comprise dopants implanted into the first device substrate 114. Other configurations and/or compositions of the one or more conductive regions 120 are within the scope of the present disclosure.

According to some embodiments, the first chip 106 comprises a transistor 126 comprising a dielectric region 122 and a gate electrode 124. The dielectric region 122 comprises a dielectric material such as at least one of oxide, nitride, or other suitable materials. The gate electrode 124 comprises a conductive material such as at least one of polysilicon, metal, or other suitable materials. Other configurations and/or compositions of the transistor 126 are within the scope of the present disclosure.

According to some embodiments, the first chip 106 comprises one or more first dielectric layers 128 over the first device substrate 114. At least some of the one or more first dielectric layers 128 are interlayer dielectric (ILD) layers comprising at least one of tetraethylorthosilicate (TEOS), borophosphosilicate glass (BPSG), fused silica glass (FSG), phosphosilicate glass (PSG), boron doped silicon glass (BSG), or other suitable materials. At least some of the one or more first dielectric layers 128 are formed by at least one of physical vapor deposition (PVD), sputtering, chemical vapor deposition (CVD), low pressure CVD (LPCVD), atomic layer chemical vapor deposition (ALCVD), ultrahigh vacuum CVD (UHVCVD), reduced pressure CVD (RPCVD), atomic layer deposition (ALD), molecular beam epitaxy (MBE), liquid phase epitaxy (LPE), spin on, growth, or other suitable techniques. Other configurations and/or compositions of the one or more first dielectric layers 128 are within the scope of the present disclosure.

According to some embodiments, the first chip 106 comprises one or more first metal layers 134 over one or more first dielectric layers 128. At least some of the one or more first metal layers 134 comprise copper, aluminum, silver, doped polysilicon, and/or other suitable materials. At least some of the one or more first metal layers 134 are formed by at least one of PVD, sputtering, CVD, LPCVD, ALCVD, UHVCVD, RPCVD, ALD, MBE, LPE, spin on, growth, or other suitable techniques. Other configurations and/or compositions of the one or more first metal layers 134 are within the scope of the present disclosure.

According to some embodiments, the first chip 106 comprises one or more second dielectric layers 130 over one or more first metal layers 134. At least some of the one or more second dielectric layers 130 comprise at least one of TEOS, BPSG, FSG, PSG, BSG, or other suitable materials. At least some of the one or more second dielectric layers 130 are formed by at least one of PVD, sputtering, CVD, LPCVD, ALCVD, UHVCVD, RPCVD, ALD, MBE, LPE, spin on, growth, or other suitable techniques. At least some of the one or more second dielectric layers 130 have a same material composition as at least some of the one or more first dielectric layers 128. At least some of the one or more second dielectric layers 130 have a different material composition than at least some of the one or more first dielectric layers 128. Other configurations and/or compositions of the one or more second dielectric layers 130 are within the scope of the present disclosure.

According to some embodiments, the first chip 106 comprises an interconnection layer 146 over one or more second dielectric layers 130. At least some of the interconnection layer 146 comprises silicon, oxide, nitride, or other suitable materials. At least some of the interconnection layer 146 is formed by at least one of PVD, sputtering, CVD, LPCVD, ALCVD, UHVCVD, RPCVD, ALD, MBE, LPE, spin on, growth, or other suitable techniques. Other configurations and/or compositions of the interconnection layer 146 are within the scope of the present disclosure.

According to some embodiments, the first chip 106 comprises one or more vertical interconnect accesses (VIAs) 132 formed through at least some of the one or more first dielectric layers 128, one or more first metal layers 134, and/or one or more second dielectric layers 130. At least some of the one or more VIAs 132 comprise copper and/or other suitable materials. At least some of the one or more VIAs 132 are formed by at least one of lithography, etching, PVD, sputtering, CVD, LPCVD, ALCVD, UHVCVD, RPCVD, ALD, MBE, LPE, spin on, growth, or other suitable techniques. According to some embodiments, at least some of the one or more first metal layers 134 are in electrical communication with at least some of the one or more VIAs 132, and at least some of the one or more VIAs 132 are in electrical communication with one or more conductive regions 120 such that a metal layer of the one or more first metal layers 134 and a VIA of the one or more VIAs 132 provide an electrical pathway through the one or more first dielectric layers 128 and/or the one or more second dielectric layers 130 to a conductive region of the one or more conductive regions 120. Other configurations and/or compositions of the one or more VIAs 132 are within the scope of the present disclosure.

According to some embodiments, the first chip 106 comprises one or more interface VIAs 136 formed through at least some of the interconnection layer 146. At least some of the one or more interface VIAs 136 comprise copper and/or other suitable materials. At least some of the one or more interface VIAs 136 are formed by at least one of lithography, etching, PVD, sputtering, CVD, LPCVD, ALCVD, UHVCVD, RPCVD, ALD, MBE, LPE, spin on, growth, or other suitable techniques. According to some embodiments, at least some of the one or more interface VIAs 136 are in electrical communication with at least some of the one or more VIAs 132 such that at least one electrical pathway is established from an interface VIA 136 down to a conductive region 120. Other configurations and/or compositions of the one or more interface VIAs 136 are within the scope of the present disclosure.

According to some embodiments, the second chip 108 comprises one or more of a type or types of structures, regions, and/or layers as the types of structures, regions, and/or layers of the first chip 106, and/or other suitable types of structures, regions, and/or layers. According to some embodiments, the second chip 108 corresponds to a SoIC, CoW, or CoWoS device. Although not discussed in detail to avoid repetition of disclosure, the second chip 108 may comprise one or more of a second device substrate 138, implant regions, STI structures, conductive regions, dielectric regions, gate electrodes, transistors, dielectric layers, metal layers, VIAs, an interconnection layer, and/or interface VIAs similar to or different than at least some of those of the first chip 106. In some embodiments, the second chip 108 comprises components, structures, regions, layers, and/or interconnects that are the same as components, structures, regions, layers, and/or interconnects of the first chip 106. In some embodiments, the second chip 108 comprises components, structures, regions, layers, and/or interconnects that are different than components, structures, regions, layers, and/or interconnects of the first chip 106. Other configurations and/or compositions of the second chip 108 are within the scope of the present disclosure.

Figure 2:
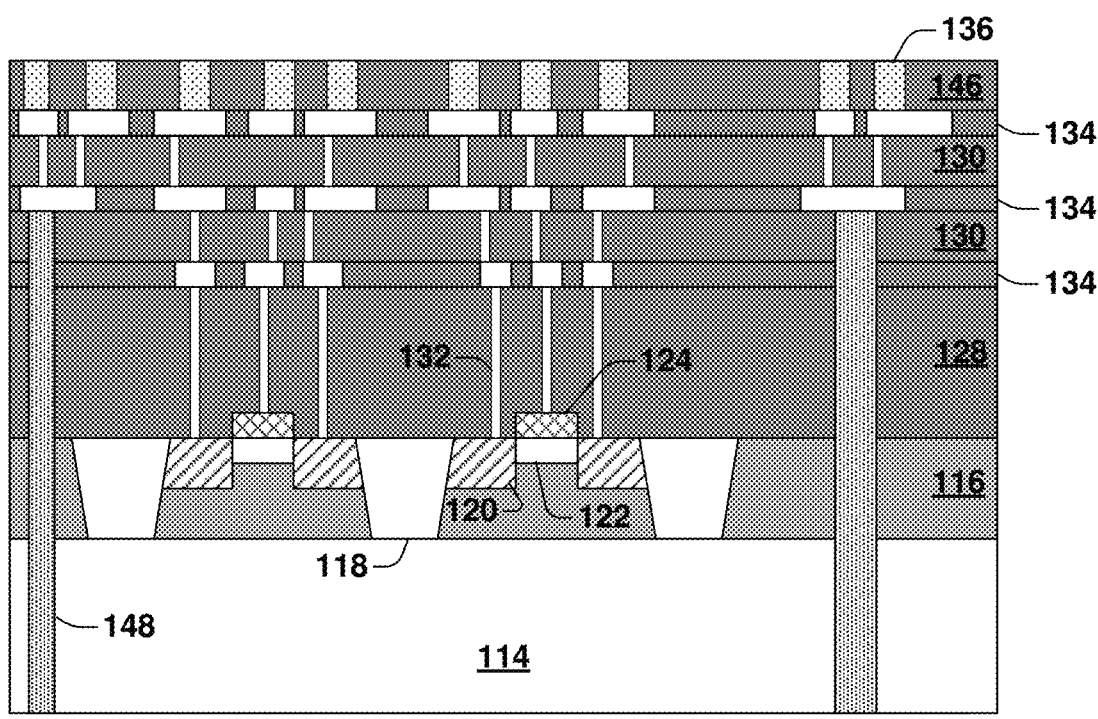
FIG. 2 is an illustration of a side view of a chip, according to some embodiments.

FIG. 2 is an illustration of a configuration of the first chip 106, according to some embodiments. The first chip 106 comprises the first device substrate 114, the implant region 116 over the first device substrate 114, the one or more first dielectric layers 128 over the implant region 116, the one or more first metal layers 134 over the one or more first dielectric layers 128, the one or more second dielectric layers 130 over the one or more first metal layers 134, and the interconnection layer 146. The first chip 106 comprises the STI structures 118, the one or more conductive regions 120, and the dielectric region 122 within the implant region 116. The gate electrode 124 overlies the dielectric region 122. The first chip 106 comprises the one or more VIAs 132 electrically coupled to the gate electrode 124 and the one or more conductive regions 120. The first chip 106 comprises the one or more interface VIAs 136 that are formed within the interconnection layer 146, and one or more inter-chip VIAs 148 that are formed through the first device substrate 114. Other configurations and/or compositions of the first chip 106 are within the scope of the present disclosure.

Figure 3:
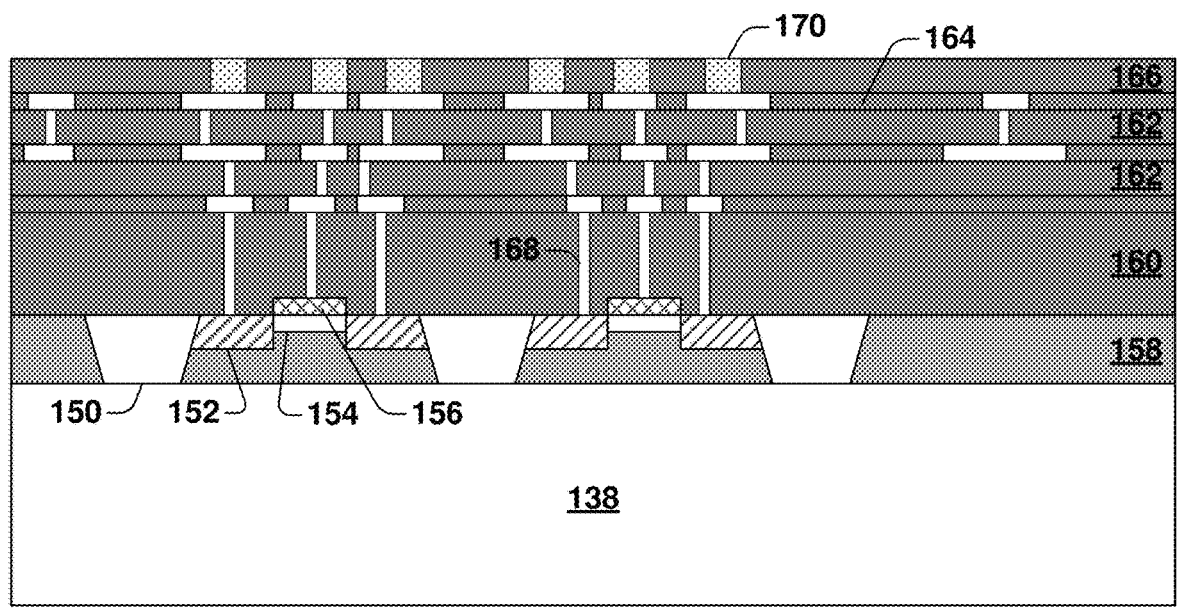
FIG. 3 is an illustration of a side view of a chip, according to some embodiments.

FIG. 3 is an illustration of the second chip 108, according to some embodiments. The second chip 108 comprises the second device substrate 138, an implant region 158 over the second device substrate 138, one or more first dielectric layers 160 over the implant region 158, one or more metal layers 164 over the one or more first dielectric layers 160, one or more second dielectric layers 162 over the one or more metal layers 164, and an interconnection layer 166 over the one or more metal layers 164. The second chip 108 comprises STI structures 150, one or more conductive regions 152, and a dielectric region 154 within the implant region 158. A gate electrode 156 overlies the dielectric region 154. The second chip 108 comprises one or more VIAs 168 electrically coupled to the gate electrode 156 and the one or more conductive regions 152. One or more interface VIAs 170 are formed within the interconnection layer 166. Other configurations and/or compositions of the second chip 108 are within the scope of the present disclosure.

Figure 4:
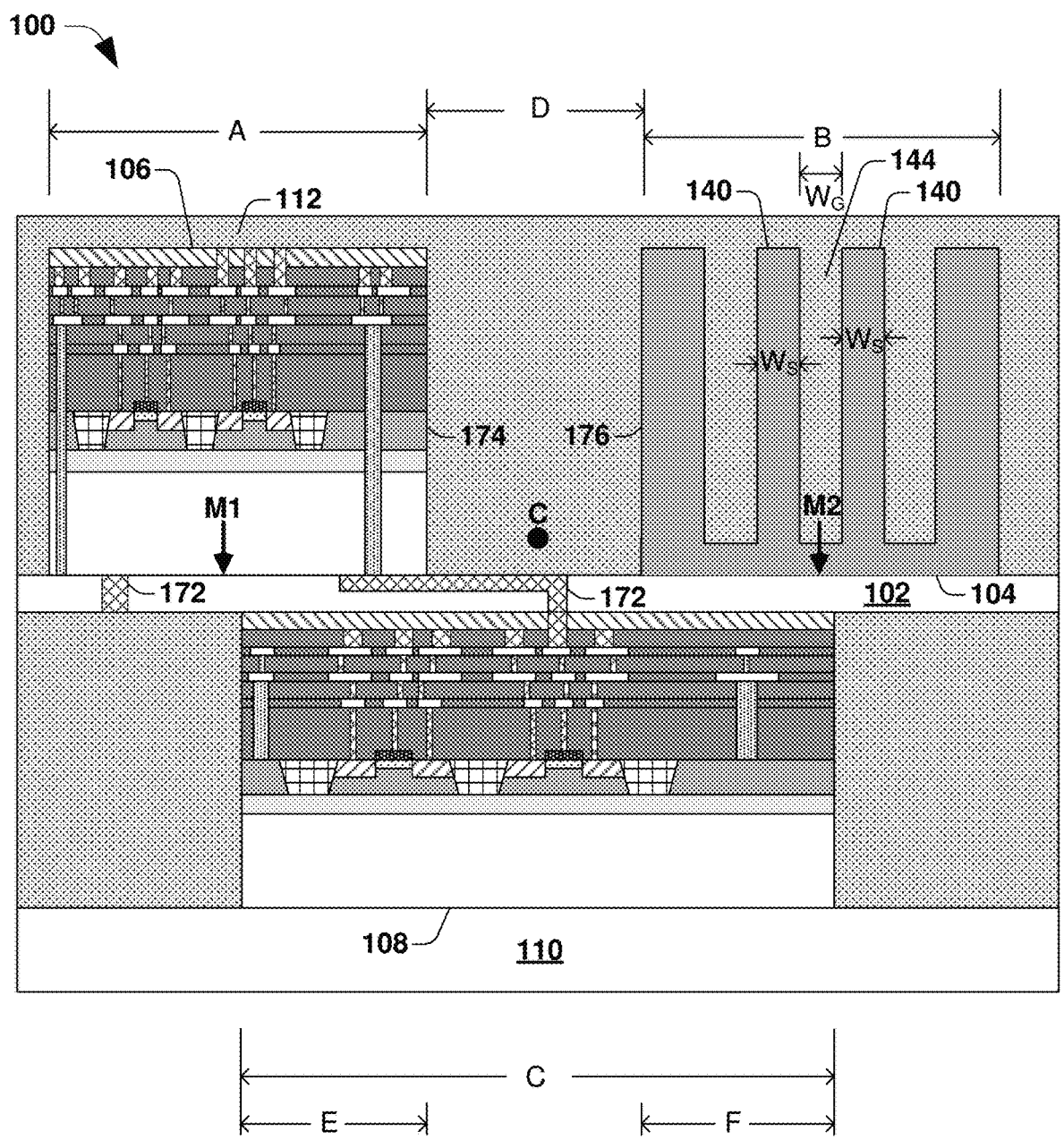
FIG. 4 is an illustration of a side view of a semiconductor device, according to some embodiments.

FIG. 4 is an illustration of the semiconductor device 100, according to some embodiments. The semiconductor device 100 comprises the substrate 102, the dummy die 104, the first chip 106, the second chip 108, the packaging material 110, and the stress relief material 112. According to some embodiments, the semiconductor device 100 comprises conductors 172 coupled to the first chip 106 and to the second chip 108.

In some embodiments, the first chip 106 has a width A, the second chip 108 has a width C, and the dummy die 104 has a width B. In some embodiments, $C \geq B \geq A$. In some embodiments, $C \geq A \geq B$. In some embodiments, $B \geq A \geq C$. In some embodiments, $B \geq C \geq A$. In some embodiments, $A \geq B \geq C$. In some embodiments, A≥C≥B. In some embodiments, the first chip 106 has a mass M1 and the dummy die 104 has a mass M2. In some embodiments, M1≥M2. In some embodiments, M1=M2 such that the mass of the first chip corresponds to the mass of the dummy die. In some embodiments, M2≥M1. In some embodiments, M1 is distributed evenly across A. In some embodiments, M1 is distributed unevenly across A. In some embodiments, M2 is distributed evenly across B. In some embodiments, M2 is distributed unevenly across B. In some embodiments, a center-point of M1 along width A is closer to center-point C than is a mid-point of width A. In some embodiments, a center-point of M1 along width A is further from center-point C than is a mid-point of width A. In some embodiments, a center-point of M2 along width B is closer to center-point C than is a mid-point of width B. In some embodiments, a center-point of M2 along width B is further from center-point C than is a mid-point of width C. In some embodiments, a center-point of M1 along width A is closer to center-point C than is a mid-point of width A, and a center-point of M2 along width B is closer to center-point C than is a mid-point of width B. In some embodiments, a center-point of M1 along width A is further from center-point C than is a mid-point of width A, and a center-point of M2 along width B is further from center-point C than is a mid-point of width B. Other distributions of masses M1 and M2 along widths A and B, respectively, are within the scope of the present disclosure.

According to some embodiments, the gap 144 is defined as the area between dummy die segments 140. A width $W_S$ of one or more dummy die segments of the dummy die segments 140 may be less than a width $W_G$ of the gap 144. In some embodiments, at least one dummy die segment is different than, such as in width, another dummy die segment.

The first chip 106 comprises a sidewall 174 and the dummy die comprises an exterior sidewall 176. In some embodiments, a distance D between sidewall 174 and exterior sidewall 176 is less than at least one of width A or width B. In some embodiments, the distance D between the sidewall 174 and the exterior sidewall 176 is greater than at least one of width A or width B.

In some embodiments, the second chip 108 has a width C. In some embodiments, C≥A and C≥B. In some embodiments, C≤A and C≤B. In some embodiments, C≥A and C≤B. In some embodiments, C≤A and C≥B. In some embodiments, the first chip 106 and the second chip 108 overlap in the vertical direction by a distance E. In some embodiments, the dummy die 104 and the second chip 108 overlap in the vertical direction by a distance F. In some embodiments, E≥F. In some embodiments, F≥E. According to some embodiments the relative positioning, spacing, degree of overlap, etc. between at least two of the dummy die 104, the first chip 106, and the second chip 108 mitigate warpage of the substrate 102. For example, in the absence of the mass/weight of the dummy die 104, the weight/mass of the first chip 106 might cause a portion of the substrate 102 under the first chip 106 to deflect in a direction down toward the second chip 108, where such defection may be exacerbated if at least some of the second chip 108 does not vertically underlie at least some of the first chip 106. Other layouts of the first chip 106, the second chip 108, and the dummy die 104 are within the scope of the present disclosure.

Figure 5:
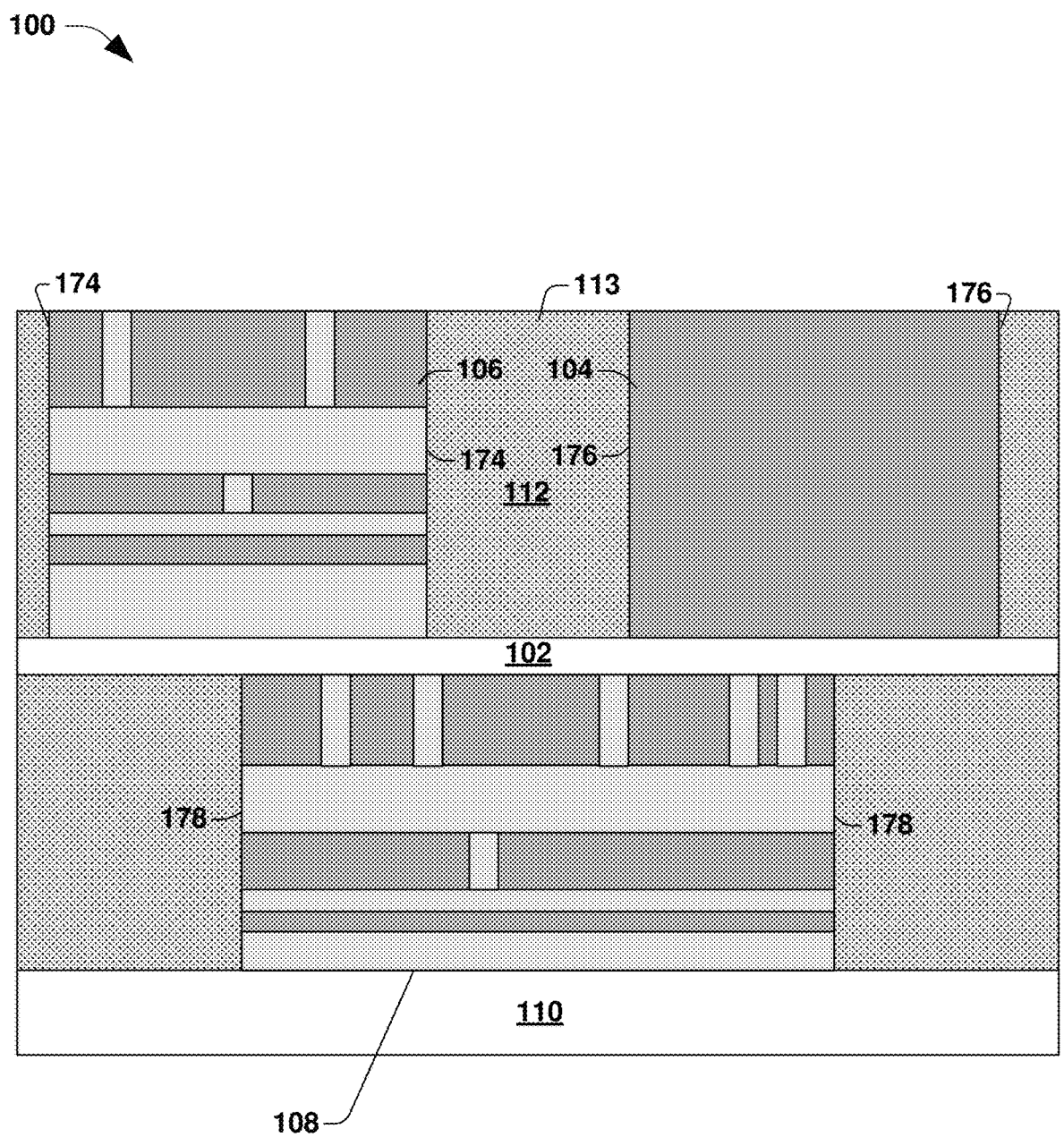
FIGS. 5-8 illustrate a method of forming a semiconductor device, according to some embodiments.

FIGS. 5-8 illustrate a method of forming the dummy die 104, according to some embodiments. Referring to FIG. 5, the method comprises mounting the first chip 106, the second chip 108, and the dummy die 104 on the substrate 102. In some embodiments, at least one of the first chip 106, the second chip 108, or the dummy die 104 are bonded to the substrate 102 via an adhesive, mechanical structure, and/or other suitable techniques. Areas of the semiconductor device 100 defined at least partially by and adjacent to sidewalls 174, exterior sidewalls 176, or sidewalls 178 may comprise the stress relief material 112.

In some embodiments, the dummy die 104 is formed by forming a layer of dummy die material on the substrate 102 and patterning the layer of dummy die material to establish the dummy die 104. At least one of the first chip 106 or second chip 108 are bonded to the substrate 102 before or after the dummy die 104 is formed on the substrate. If the first chip 106 is bonded to the substrate 102 before dummy die 104 is formed on the substrate 102, then the first chip 106 is masked off and protected, such as from an etchant, when the layer of dummy die material is formed and patterned to establish the dummy die 104. In some embodiments, at least one of lithography, etching, PVD, sputtering, CVD, LPCVD, ALCVD, UHVCVD, RPCVD, MBE, LPE, a dual damascene process, or other suitable techniques are implemented to form the dummy die 104 on the substrate 102.

The stress relief material 112 is formed using at least one of lithography, etching, PVD, sputtering, CVD, LPCVD, ALCVD, UHVCVD, RPCVD, MBE, LPE, a dual damascene process, or other suitable techniques. In some embodiments where the stress relief material 112 is formed before at least one of the first chip 106, the second chip 108, or the dummy die 104, the stress relief material 112 is patterned to form one or more openings into which at least one of the first chip 106, the second chip 108, or the dummy die 104 are formed.

Figure 6:
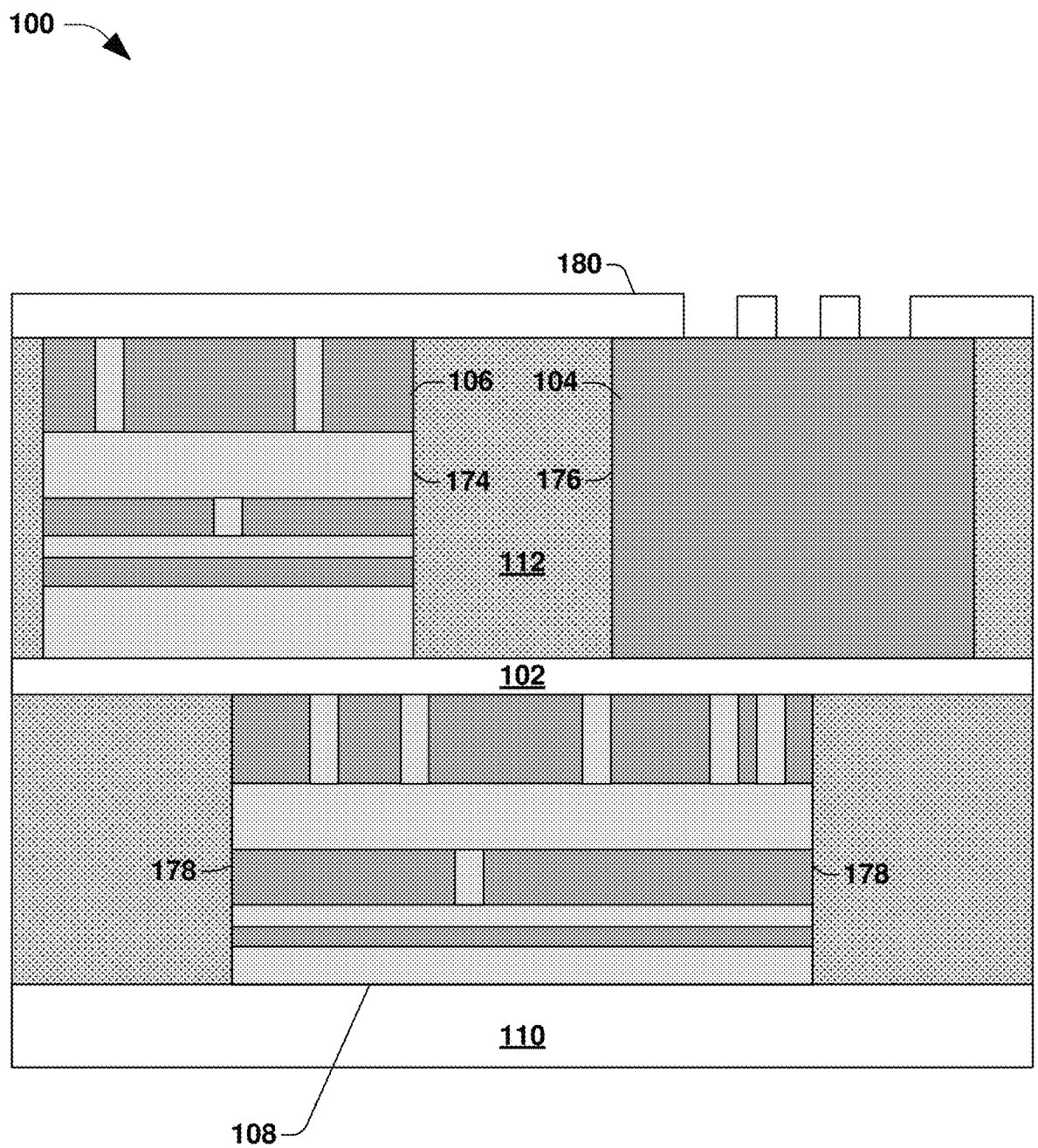

Referring to FIG. 6, a light sensitive material such as a photoresist is formed over, among other things, the dummy die 104 and patterned to form a photolithographic pattern 180. Properties, such as solubility, of the photoresist are affected by light. The photoresist is either a negative photoresist or a positive photoresist. With respect to the negative photoresist, regions of the negative photoresist become insoluble when illuminated by a light source, such that application of a solvent to the negative photoresist during a subsequent development stage removes non-illuminated regions of the negative photoresist. The photolithographic pattern 180 formed from the negative photoresist is thus a negative of a pattern defined by opaque regions of a template between the light source and the negative photoresist. In the positive photoresist, illuminated regions of the photoresist become soluble and are removed via application of the solvent during development. Thus, the photolithographic pattern 180 formed from the positive photoresist is a positive image of opaque regions of the template between the light source and the positive photoresist.

Figure 7:
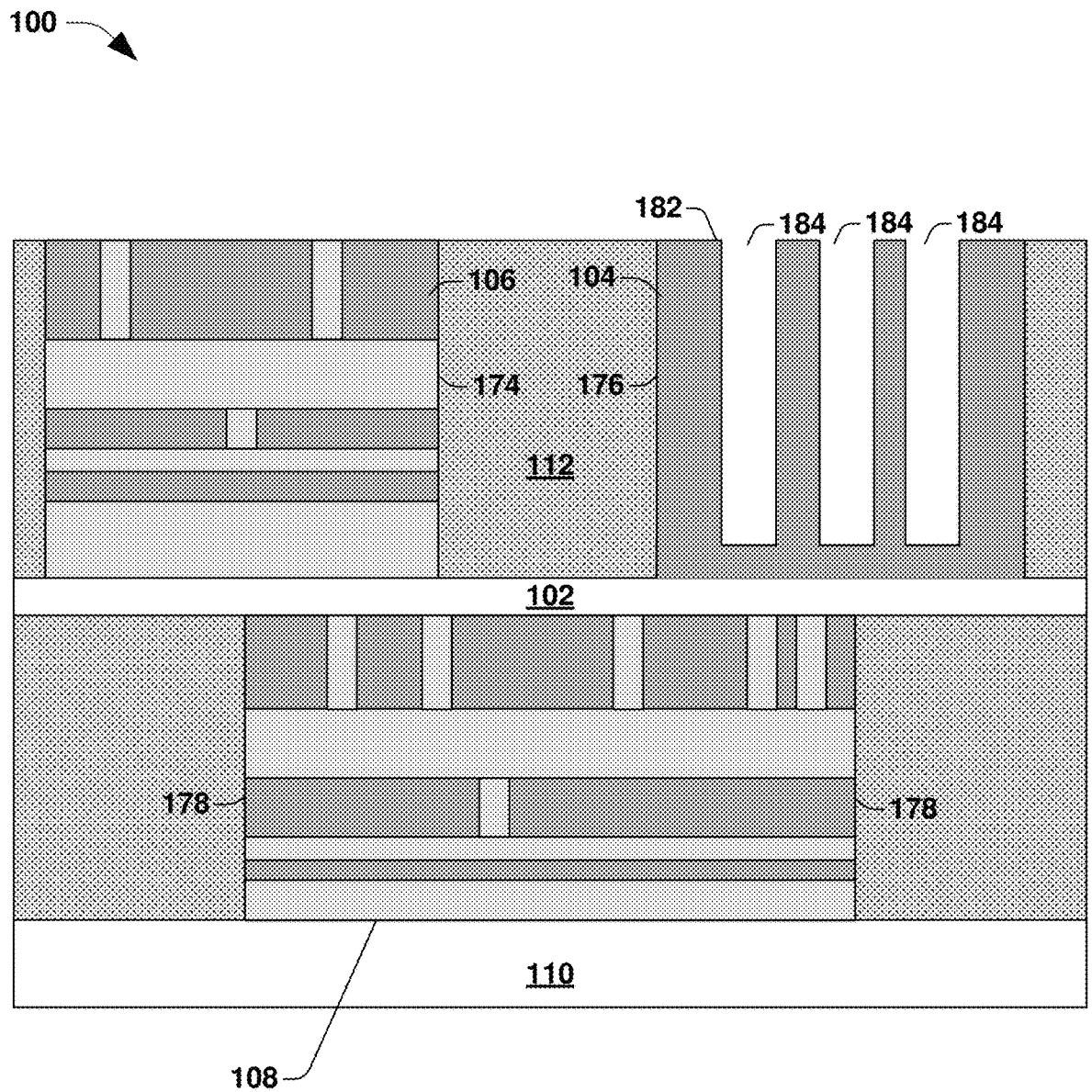

Referring to FIG. 7, the dummy die 104 is patterned using the photolithographic pattern 180. According to some embodiments, an etchant is used to pattern the dummy die 104. According to some embodiments, the etchant has a selectivity such that the etchant removes or etches away exposed areas of the dummy die 104 at a greater rate than the etchant removes or etches away the photolithographic pattern 180 defined by remaining portions of the photoresist. Accordingly, gaps 184 are formed in the dummy die 104 that correspond to openings in the photolithographic pattern 180. The pattern in the photolithographic pattern 180 is thus transferred to the dummy die 104. The photolithographic pattern 180 is thereafter removed, such as by stripping, acid washing, chemical mechanical polishing (CMP), etc.

Figure 8:
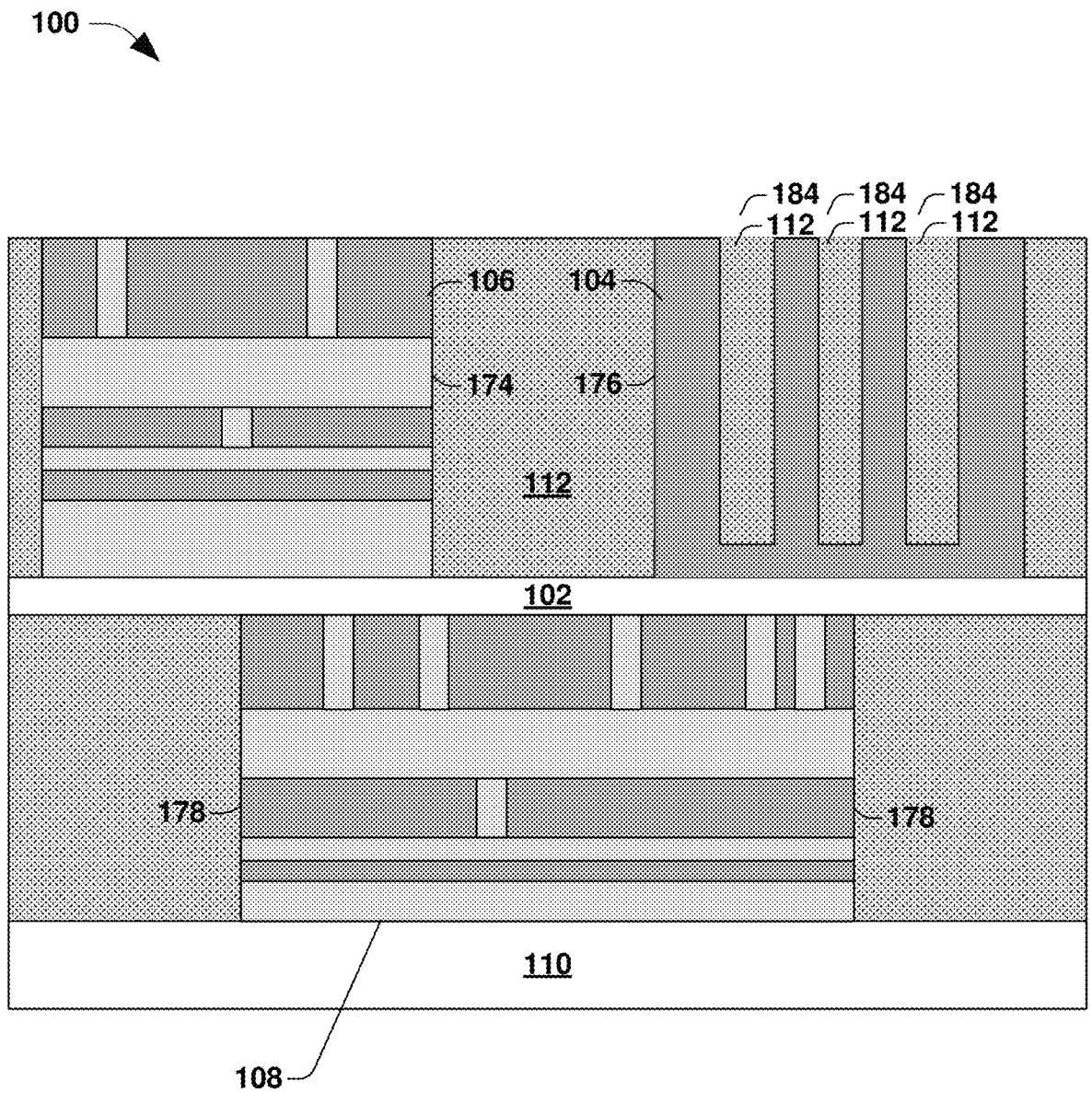

Referring to FIG. 8, the gaps 184 are filled with one or more materials, such as the stress relief material 112. As described above, the material composition of the material filled in to the gaps 184 may or may not be the same as the material composition of the material between the sidewalls 174, 176. According to some embodiments, the photolithographic pattern 180 is removed after the gaps 184 are filled with the stress relief material 112, such as via CMP which also removes and/or planarizes excess stress relief material 112. According to some embodiments, the stress relief material 112 is concurrently filled into the gaps 184 and between the sidewalls 174, 176. Other methods of forming the dummy die 104 having are within the scope of the present disclosure.

Figure 9:
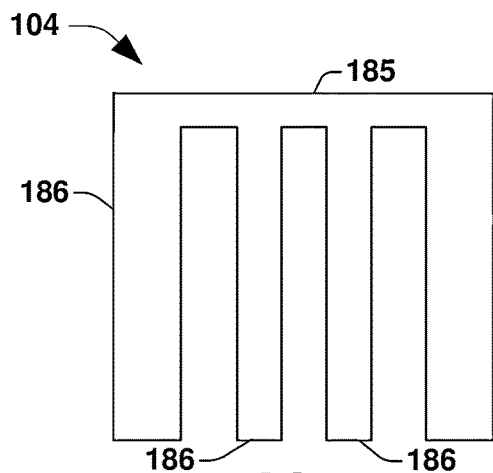
FIGS. 9-14 each illustrate an embodiment of a dummy die, according to some embodiments.
Figure 10:
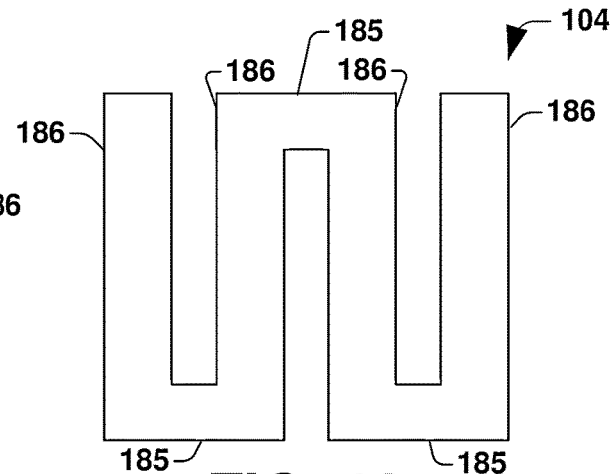
Figure 11:
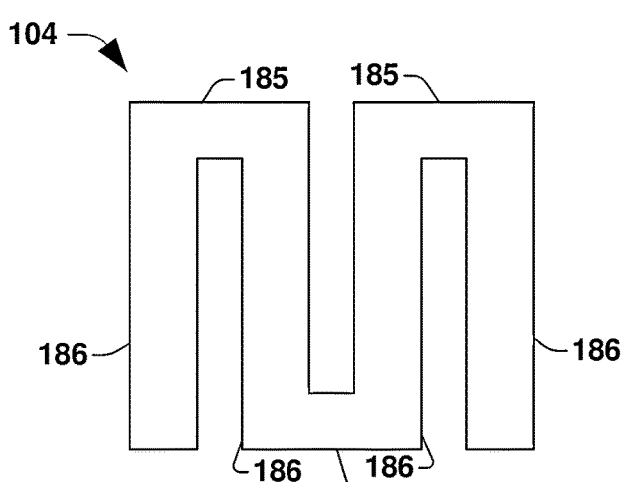
Figure 12:
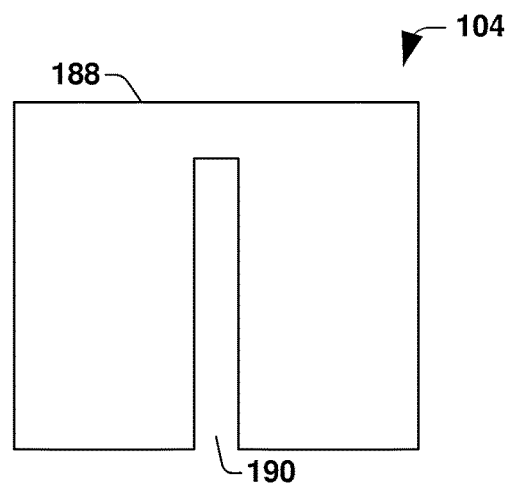
Figure 13:
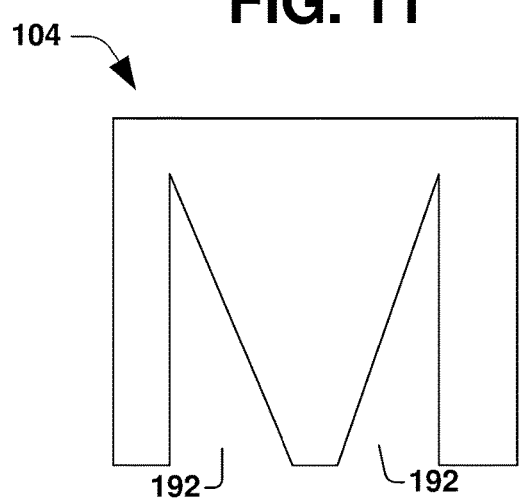
Figure 14:
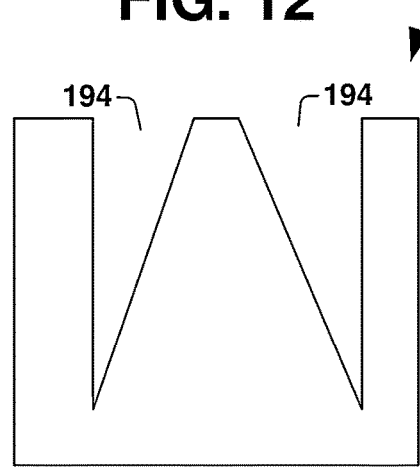

FIGS. 9-14 each illustrate an embodiment of the dummy die 104, according to some embodiments. Referring to FIG. 9, the dummy die 104 comprises a horizontal segment 185 and four vertical segments 186 extending at an approximately 90° angle from the horizontal segment 185. Referring to FIG. 10, the dummy die 104 comprises four vertical segments 186 and three horizontal segments 185 in an upwards-facing zig-zag formation. Referring to FIG. 11, the dummy die 104 comprises four vertical segments 186 and three horizontal segments 185 in a downwards-facing zig-zag formation. Referring to FIG. 12, the dummy die 104 has a block shape 188 with a slot 190 through a portion of the dummy die 104. Referring to FIG. 13, the dummy die 104 has an "M" shape with two triangular-shaped slots 192. Referring to FIG. 14, the dummy die 104 has a "W" shape with two triangular-shaped slots 194. One or more of the gaps, openings, voids, etc. in the dummy dies are filled with one or more material compositions of the stress relief material 112, in accordance with some embodiments. The amount, shape, dimensions, etc. of dummy die material that is removed in patterning the dummy die, the amount, shape, dimensions, etc. of remaining dummy die material that is not removed in patterning the dummy die, the amount, composition, shape, dimensions, etc. of the stress relief material 112 filled into the patterned dummy die, etc. are a function of, among other things, the mass of one or more chips that are to be counterbalanced, the rigidity of the substrate, etc., and are thus selected so as to achieve desired balance, distribution, etc. of mass on the substrate and/or mitigation of warpage of the substrate.

According to some embodiments, formation of the dummy die occurs in one or more patterning and/or fill actions. For example, to form at least one of the embodiments illustrated in FIGS. 9-13, one or more first patterning actions are performed, such as with one or more photolithographic patterns, to form vertical segments of the dummy die and then one or more subsequent patterning actions, such as with one or more other photolithographic patterns, are performed, possibly after one or more fill actions are performed, to form horizontal segments of the dummy die. Other shapes of the dummy die 104 are within the scope of the present disclosure.

As previously mentioned, any number, shape, size, placement, orientation, mass, stress balance pattern, etc. of dummy dies are located in, on, around, etc. the substrate 102 to balance at least one of the number, shape, size, placement, orientation, mass, etc. of one or more chips on the substrate 102 and mitigate warpage of the substrate 102.

According to some embodiments, a method includes bonding a dummy die to a substrate, forming a photolithographic pattern on the dummy die, patterning the dummy die using the photolithographic pattern to form a first gap in the dummy die, and filling the first gap with a stress relief material.

According to some embodiments, a semiconductor device includes a substrate, a dummy die over the substrate, wherein the dummy die includes a first interior sidewall and a second interior sidewall, and a stress relief material between the first interior sidewall and the second interior sidewall of the dummy die.

According to some embodiments, a semiconductor device includes a substrate and a dummy die over the substrate. The dummy die includes a first dummy die segment and a second dummy die segment. A first gap is defined between the first dummy die segment and the second dummy die segment, and a first width of the first dummy die segment is less than a second width of the first gap.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

Although the subject matter has been described in language specific to structural features or methodological acts, it is to be understood that the subject matter of the appended claims is not necessarily limited to the specific features or acts described above. Rather, the specific features and acts described above are disclosed as example forms of implementing at least some of the claims.

Various operations of embodiments are provided herein. The order in which some or all of the operations are described should not be construed to imply that these operations are necessarily order dependent. Alternative ordering will be appreciated having the benefit of this description. Further, it will be understood that not all operations are necessarily present in each embodiment provided herein. Also, it will be understood that not all operations are necessary in some embodiments.

It will be appreciated that layers, features, elements, etc. depicted herein are illustrated with particular dimensions relative to one another, such as structural dimensions or orientations, for example, for purposes of simplicity and ease of understanding and that actual dimensions of the same differ substantially from that illustrated herein, in some embodiments. Additionally, a variety of techniques exist for forming the layers, regions, features, elements, etc. mentioned herein, such as at least one of etching techniques, planarization techniques, implanting techniques, doping techniques, spin-on techniques, sputtering techniques, growth techniques, or deposition techniques such as CVD, for example.

Moreover, "exemplary" is used herein to mean serving as an example, instance, illustration, etc., and not necessarily as advantageous. As used in this application, "or" is intended to mean an inclusive "or" rather than an exclusive "or". In addition, "a" and "an" as used in this application and the appended claims are generally to be construed to mean "one or more" unless specified otherwise or clear from context to be directed to a singular form. Also, at least one of A and B and/or the like generally means A or B or both A and B. Furthermore, to the extent that "includes", "having", "has", "with", or variants thereof are used, such terms are intended to be inclusive in a manner similar to the term "comprising".

Also, unless specified otherwise, "first," "second," or the like are not intended to imply a temporal aspect, a spatial aspect, an ordering, etc. Rather, such terms are merely used as identifiers, names, etc. for features, elements, items, etc. For example, a first element and a second element generally correspond to element A and element B or two different or two identical elements or the same element.

Also, although the disclosure has been shown and described with respect to one or more implementations, equivalent alterations and modifications will occur to others of ordinary skill in the art based upon a reading and understanding of this specification and the annexed drawings. The disclosure comprises all such modifications and alterations and is limited only by the scope of the following claims. In particular regard to the various functions performed by the above described components (e.g., elements, resources, etc.), the terms used to describe such components are intended to correspond, unless otherwise indicated, to any component which performs the specified function of the described component (e.g., that is functionally equivalent), even though not structurally equivalent to the disclosed structure. In addition, while a particular feature of the disclosure may have been disclosed with respect to only one of several implementations, such feature may be combined with one or more other features of the other implementations as may be desired and advantageous for any given or particular application.

What is claimed is:

1. A method, comprising:
   bonding a dummy die to a substrate;
   forming a photolithographic pattern on the dummy die;
   patterning the dummy die using the photolithographic pattern to form a first gap in the dummy die, wherein:
      patterning the dummy die comprises removing a first portion of the dummy die to define a first dummy die segment and a second dummy die segment,
      a second portion of the dummy die extends between the first dummy die segment and the second dummy die segment, and
      the first gap is defined by a sidewall of the first dummy die segment, a sidewall of the second dummy die segment, and a top surface of the second portion of the dummy die extending between the first dummy die segment and the second dummy die segment; and
   filling the first gap with a stress relief material.

2. The method of claim 1, comprising:
   patterning the dummy die using the photolithographic pattern to form a second gap in the dummy die; and
   filling the second gap with the stress relief material.

3. The method of claim 1, comprising:
   bonding a chip to the substrate, wherein a sidewall of the chip and an exterior sidewall of the dummy die define a second gap between the chip and the dummy die.

4. The method of claim 3, comprising:
   filling the second gap between the chip and the dummy die with a material.

5. The method of claim 4, wherein the material is silicon dioxide.

6. The method of claim 4, wherein the material is the stress relief material.

7. The method of claim 1, wherein the stress relief material is undoped silicon glass.

8. The method of claim 1, wherein filling the first gap with the stress relief material comprises:
   forming the stress relief material such that a first portion of the stress relief material contacts the substrate and a second portion of the stress relief material fills the first gap, wherein a height of the first portion of the stress relief material is different than a height of the second portion of the stress relief material.

9. A method, comprising:
   forming a first chip over a substrate;
   forming a second chip under the substrate;
   forming a dummy die over the substrate, wherein the second chip underlies the first chip and the dummy die; and
   forming a stress relief material in a gap defined by a first dummy die segment of the dummy die and a second dummy die segment of the dummy die and forming the stress relief material between the first chip and the first dummy die segment.

10. The method of claim 9, wherein a mass of the dummy die is equal to a mass of the first chip.

11. The method of claim 9, wherein forming the dummy die comprises:
   bonding the dummy die to the substrate; and
   patterning the dummy die to define the first dummy die segment and the second dummy die segment.

12. The method of claim 9, wherein forming the stress relief material between the first chip and the first dummy die segment comprises forming the stress relief material to contact a sidewall of the first chip and a sidewall of the first dummy die segment.

13. The method of claim 9, comprising forming a packaging material under the second chip.

14. The method of claim 13, comprising forming the stress relief material between the second chip and the packaging material.

15. A method, comprising:
   bonding a dummy die to a substrate;
   forming a photolithographic pattern on the dummy die;
   patterning the dummy die using the photolithographic pattern to form a first gap in the dummy die; and
   filling the first gap with a stress relief material, wherein filling the first gap with the stress relief material comprises:
      forming the stress relief material such that a first portion of the stress relief material contacts the substrate and a second portion of the stress relief material fills the first gap, wherein a height of the first portion of the stress relief material is different than a height of the second portion of the stress relief material.

16. The method of claim 15, wherein the stress relief material is undoped silicon glass.

17. The method of claim 15, comprising:
   bonding a chip to the substrate, wherein a sidewall of the chip and an exterior sidewall of the dummy die define a second gap between the chip and the dummy die.

18. The method of claim 17, comprising:
   filling the second gap between the chip and the dummy die with silicon dioxide.

19. The method of claim 15, comprising:
   patterning the dummy die to form a second gap in the dummy die; and
   filling the second gap with the stress relief material.

* * * * *